US009166551B2

(12) United States Patent
Lee et al.

(10) Patent No.: US 9,166,551 B2
(45) Date of Patent: Oct. 20, 2015

(54) APPARATUS AND METHOD FOR MATCHING IMPEDANCE USING STANDING WAVE RATIO INFORMATION

(75) Inventors: Sang Hun Lee, Seoul (KR); Sung Bae Cho, Seoul (KR); Dong Chan Park, Seoul (KR); Chang Wook Kim, Seoul (KR); Ju Young Song, Seoul (KR); Hyeong Seok Jang, Daejeon (KR); Jong Won Yu, Daejeon (KR)

(73) Assignee: LG INNOTEK CO., LTD., Seoul (KR)

( * ) Notice: Subject to any disclaimer, the term of this patent is extended or adjusted under 35 U.S.C. 154(b) by 354 days.

(21) Appl. No.: 13/180,833

(22) Filed: Jul. 12, 2011

(65) Prior Publication Data

US 2012/0026063 A1 Feb. 2, 2012

(30) Foreign Application Priority Data

Aug. 2, 2010 (KR) ........................ 10-2010-0074591

(51) Int. Cl.
| H01Q 1/50 | (2006.01) |
| H03H 7/40 | (2006.01) |
| H04B 1/04 | (2006.01) |
| H03H 11/40 | (2006.01) |

(52) U.S. Cl.
CPC ................. *H03H 7/40* (2013.01); *H03H 11/40* (2013.01); *H04B 1/0458* (2013.01)

(58) Field of Classification Search
CPC ......... H03H 7/40; H03H 11/40; H04B 1/0458
USPC ...................................................... 343/860
See application file for complete search history.

(56) References Cited

U.S. PATENT DOCUMENTS

| 3,281,721 | A | * | 10/1966 | Clark ........................... 333/17.1 |
| 4,201,960 | A | * | 5/1980 | Skutta et al. ................. 333/17.3 |
| 5,778,308 | A | * | 7/1998 | Sroka et al. ................ 455/115.1 |
| 6,956,896 | B2 | * | 10/2005 | Johnson ........................ 375/224 |
| 6,961,368 | B2 | * | 11/2005 | Dent et al. .................... 375/219 |
| 2005/0184922 | A1 | * | 8/2005 | Ida et al. ....................... 343/861 |

FOREIGN PATENT DOCUMENTS

| CN | 1417945 A | 5/2003 |
| EP | 0005592 A1 | 11/1979 |
| EP | 0208984 A1 | 1/1987 |

(Continued)

OTHER PUBLICATIONS

Pourmohammadi, F. et al. "Adaptive Matching of Antenna Input Impedance" Antenna Technology Small Antennas and Novel Metamaterials, 2006 IEEE International Workshop on Crowne Plaza Hotel, White Plains, New York, Mar. 6-8, 2006, Piscataway, NJ, USA, IEEE, Mar. 6, 2006, pp. 373-376.

(Continued)

*Primary Examiner* — Hoang V Nguyen
*Assistant Examiner* — Michael Bouizza
(74) *Attorney, Agent, or Firm* — Saliwanchik, Lloyd & Eisenschenk

(57) ABSTRACT

An apparatus and method for matching impedance of an antenna by using Standing Wave Ratio (SWR) information is provided. While the impedance of the impedance matching unit is controlled, a region of a Smith chart in which initial total impedance of the impedance matching unit and the antenna is located by using an SWR calculated by an SWR operation unit, and the impedance of the impedance matching unit is controlled according to the determined region, thus correctly matching the impedance of the antenna.

6 Claims, 11 Drawing Sheets

(56) References Cited

FOREIGN PATENT DOCUMENTS

| | | |
|---|---|---|
| EP | 1564896 A1 | 8/2005 |
| JP | 2001-274651 A | 10/2001 |
| JP | 2010-087845 A | 4/2010 |
| KR | 10-2008-0035888 A | 4/2008 |
| KR | 10-2010-0102319 A | 9/2010 |
| WO | WO-2008/129125 A1 | 10/2008 |
| WO | WO 2008129125 A1 * | 10/2008 |

OTHER PUBLICATIONS

Partial European Search Report dated Feb. 28, 2013 in European Application No. 11173303.6, filed Jul. 8, 2011.

Notice of Allowance dated Aug. 9, 2012 in Korean Application No. 10-2010-0074591, filed Aug. 2, 2010.

Office Action dated May 6, 2014 in Chinese Application No. 201110225226.8.

* cited by examiner

APPARATUS AND METHOD FOR MATCHING IMPEDANCE USING STANDING WAVE RATIO INFORMATION

CROSS-REFERENCE TO RELATED APPLICATION

This application claims the benefit under 35 U.S.C. §119 of Korean Patent Application No. 10-2010-0074591, filed Aug. 2, 2010 which is hereby incorporated by reference in its entirety.

BACKGROUND

The present disclosure relates to an apparatus and method for matching impedance using Standing Wave Ratio (SWR) information.

In general, various communication devices, such as mobile communication terminals, have antennas through which signals of a predetermined frequency are received and transmitted.

As for the antennas, the impedance thereof needs to be correctly made so as to achieve optimum transmission and reception radiation performance.

Therefore, a related art communication device includes an impedance matching unit using a capacitor, an inductor and the like. The antenna impedance matching is made to an optimum level by controlling the impedance of the impedance matching unit.

The impedance matching of the antenna is made in the state where the antenna is located in a free space, and the impedance matching conditions of the antenna are varied according to changes in surroundings.

Particularly, to use a mobile communication terminal, a user holds a terminal body in his hand and brings a speaker close to a speaker, or uses an earphone while placing the mobile communication terminal in a pocket, a bag or the like.

As a user uses a mobile communication terminal by holding the terminal body in his hand and bringing it close to the ear, or uses it with the body placed in a packet, a bag or the like, the impedance matching conditions of the antenna are varied, thus impairing the transmission and reception radiation performance of the antenna, the impedance of which has matched in a free space.

Therefore, communication devices automatically control antenna impedance when the impedance matching conditions of antennas are changed, such that the antennas achieve optimum transmission and reception radiation performance.

To allow an antenna to maintain its optimum transmission and reception radiation performance, impedance changes of the antenna need to be detected.

To this end, the communication devices include a directional coupler, and detect reflected power and forward power output from the directional coupler.

Also, the impedance of the antenna is matched by changing the impedance of the impedance matching unit according to the magnitude of the detected reflected power and forward power to become a standing wave ratio (SWR).

However, the above impedance matching of the antenna is associated with finding the point where the SWR is at the minimum level within a local area, rather than finding the point within the entire area where the impedance of the antenna can be varied.

Also, there are instances where it is impossible to control the SWR to be equal to or lower than a predetermined value.

BRIEF SUMMARY

Embodiments provide apparatuses and methods for matching impedance using standing wave ratio (SWR) information, capable of correctly matching the impedance of an antenna by finding a region of a Smith chart in which the impedance of an impedance matching circuit is located by using SWR information calculated from forward power and reflected power, and varying the impedance according to the found region of the Smith chart.

In one embodiment, an apparatus for matching impedance using Standing Wave Ratio (SWR) information, includes: a directional coupler extracting forward power of a transmission signal traveling to be transmitted through an antenna, and reflected power of the transmission signal reflected from the antenna; an impedance matching unit matching impedance of the antenna by varying impedance according to a control signal; a forward power detection unit detecting the forward power from an output signal of the directional coupler; a reflected power detection unit detecting the reflected power from the output signal of the directional coupler; an SWR operation unit calculating an SWR by using the forward power detected by the forward power detection unit and the reflected power detected by the reflected power detection unit; and an impedance control unit controlling impedance of the impedance matching unit while determining a region of a smith chart in which initial total impedance of the impedance matching unit and the antenna is located, by using the SWR calculated by the SWR operation unit, the impedance control unit controlling the impedance of the impedance matching unit according to the determined region to thus control impedance of the antenna to be matched.

The SWR operation unit may include: a reflection coefficient calculation part calculating a reflection coefficient by using the forward power detected by the forward power detection unit and the reflected power detected by the reflected power detection unit; and an SWR calculation part calculating an SWR from the reflection coefficient calculated by the reflection coefficient calculation part.

The region of the smith chart in which the initial total impedance is located may be determined by determining at least region in which the initial total impedance is located among a first region which is the inside region of an impedance circle within an inductive region, a second region which is the outside region of the impedance circle and an admittance circle within the inductive region, a third region in which the inside region of the admittance circle within the inductive region, a fourth region which is the inside region of the admittance circle within a capacitive region, a fifth region which is the outside region of the impedance circle and the admittance circle within the capacitive region, and a sixth region which is the inside region of the impedance circle and the admittance circle within the capacitive region.

In the matching of the impedance, the impedance control unit may control the impedance of the impedance matching unit such that total impedance of the impedance matching unit and the antenna meets an impedance circle or an admittance circle of a Smith chart and then has desired impedance.

In another embodiment, a method for matching impedance using Standing Wave Ratio (SWR) information includes: determining an initial SWR value calculated by an SWR operation unit in a state where an impedance control unit has not controlled impedance of an impedance matching unit; controlling, by the impedance control unit, the impedance of the impedance matching unit while determining, from an increase or decrease in an SWR value calculated by the SWR operation unit, whether initial total impedance of the impedance matching unit and the antenna is present in an inductive region or a capacitive region of a Smith chart; continuously controlling, by the impedance control unit, the impedance of the impedance matching unit to thus allow the SWR value calculated by the SWR operation unit to meet a real axis of the smith chart, and determining an SWR value at a point where the SWR value meets the real axis of the Smith chart; calculating values of real and imaginary parts of the initial total impedance of the impedance matching unit and the antenna by using the initial SWR value, the SWR value at the time of meeting the real axis of the Smith chart, and a value of an element changing the impedance of the impedance matching unit; determining a region of the Smith chart in which the initial total impedance is located, by using the calculated values of the real and imaginary parts; and controlling the impedance matching unit according to the determined region of the smith chart to match impedance of the antenna.

The point at which the SWR value meets the real axis of the Smith cart may be a point at which the SWR value begins to decrease after increasing or a point at which the SWR value begins to increase after decreasing.

In the determining of the region of the Smith region in which the initial total impedance is located, the Smith chart may be divided into a first region which is the inside region of an impedance circle within an inductive region, a second region which is the outside region of the impedance circle and an admittance circle within the inductive region, a third region in which the inside region of the admittance circle within the inductive region, a fourth region which is the inside region of the admittance circle within a capacitive region, a fifth region which is the outside region of the impedance circle and the admittance circle within the capacitive region, and a sixth region which is the inside region of the impedance circle and the admittance circle within the capacitive region, and it may be determined which region among the first to sixth regions the initial total impedance is located in.

In the matching of the impedance of the antenna, the impedance control unit may control the impedance of the impedance matching unit such that total impedance of the impedance matching unit and the antenna meets an impedance circle or an admittance circle of the Smith chart and then has desired impedance.

According to the apparatus and method for matching impedance using SWR information, the Smith chart is divided into a plurality of regions, and it is determined which one of the divided regions the initial total impedance of the impedance matching unit and the antenna is located in.

When the region of the Smith chart is determined, antenna impedance is made by controlling the impedance of the impedance matching unit according to the determined region.

Thus, according to the embodiments, the SWR value can be controlled to a predetermined value or less in any cases, and the impedance of the antenna can be correctly matched by controlling the impedance of the impedance matching unit over the entire range.

The details of one or more embodiments are set forth in the accompanying drawings and the description below. Other features will be apparent from the description and drawings, and from the claims.

DETAILED DESCRIPTION OF THE EMBODIMENTS

Figure 1:
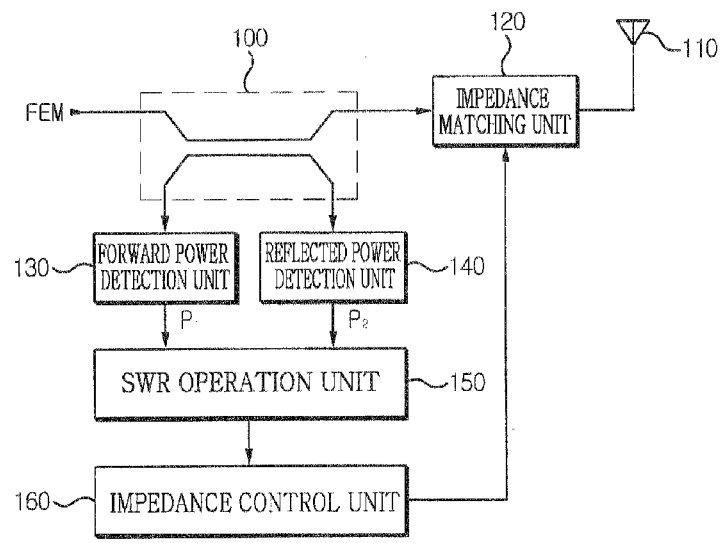
FIG. 1 is a view illustrating the configuration of an impedance matching apparatus according to an embodiment.

Reference will now be made in detail to the embodiments of the present disclosure, examples of which are illustrated in the accompanying drawings.

The following detailed description is merely for exemplifying the embodiments and is provided for useful and easy explanation on the principles and concepts of the present disclosure.

Only structural details required for the basic understanding of this disclosure are provided, and various embodiments which can be devised by those skilled in the art within the spirit and scope of the principles of this disclosure are exemplified in the drawings.

FIG. 1 is a view illustrating the configuration of an impedance matching apparatus according to an embodiment. Here, reference numeral 100 is a directional coupler. The directional coupler 100 extracts the forward power of a transmission signal FEM traveling to be transmitted through an antenna 110, and the reflected power of the transmission signal FEM reflected from the antenna 110.

Reference numeral 120 is an impedance matching unit. The impedance matching unit 120 varies impedance according to an input control signal to thus match the impedance of the antenna 110.

Reference numeral 130 is a forward power detection unit. The forward power detection unit 130 detects forward power P1 extracted by the directional coupler 100.

Reference numeral 140 is a reflected power detection unit. The reflected power detection unit 140 detects reflected power P2 extracted by the directional coupler 100.

Reference numeral 150 is a Standing Wave Ratio (SWR) operation unit. The SWR operation unit 150 calculates an SWR by using the forward power P1 detected by the forward power detection unit 130, and the reflected power P2 detected by the reflected power detection unit 140.

Reference numeral 160 is an impedance control unit. The impedance control unit 160 determines the region of a Smith chart in which the impedance of the impedance matching unit 120 is located, by using the SWR, calculated by the SWR operation unit 150, while controlling the impedance of the impedance matching unit 120. Then, the impedance control unit 160 controls the impedance of the impedance matching unit 120 according to the determined area, thus controlling the impedance of the antenna 110 to be matched.

Figure 2:
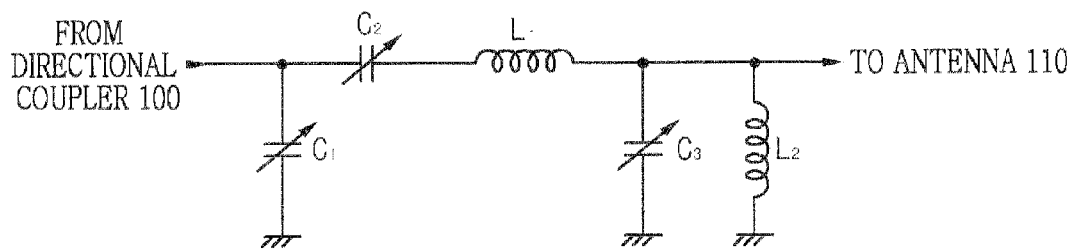
FIG. 2 is a view illustrating the detailed configuration of an impedance matching unit of the impedance matching apparatus, according to an embodiment.

As for the impedance matching unit 120, for example, as shown in FIG. 2, a variable capacitor $C_1$ is connected between the output terminal of the directional coupler 100 and the ground terminal, and the output terminal of the directional coupler 100 is connected to the antenna L1 through a variable capacitor $C_2$ and an inductor $L_1$, and a variable capacitor $C_3$ and an inductor $L_2$ are connected in parallel between a node of the inductor $L_1$ and the antenna 110 and the ground terminal.

The configuration of the impedance matching unit 120, depicted in FIG. 2, is described by way of example, and the impedance matching unit 120 may be configured in various manners.

Figure 3:
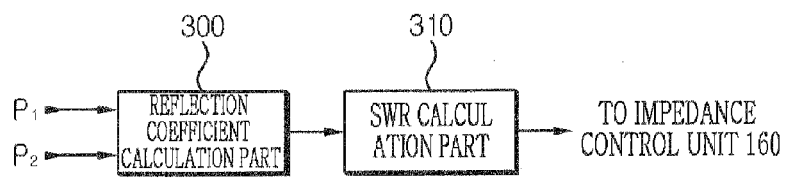
FIG. 3 is a view illustrating the configuration of a standing wave ratio (SWR) operation unit of the impedance matching apparatus, according to an embodiment.

The SWR operation unit 150, as shown in FIG. 3, includes a reflection coefficient calculation part 300 calculating a reflection coefficient by using the forward power P1 detected by the forward power detection unit 130 and the reflected power P2 detected by the reflected power detection unit 140, and an SWR calculation part 310 calculating an SWR by using the reflection coefficient calculated by the reflection coefficient calculation part 300.

In the impedance matching apparatus having the above configuration, an input transmission signal FEM is applied to the antenna 110 through the directional coupler 100 and the impedance matching unit 120 and is then transmitted.

In this case, the transmission signal FEM is reflected according to the impedance matching state of the antenna 110, and the reflected signal is input to the directional coupler 100.

Then, the directional coupler 100 extracts the forward power of the transmission signal FEM traveling to the antenna 110, and the reflected power thereof reflected from the antenna 100.

The forward power and the reflected power, extracted by the directional coupler 100, are respectively input to the forward power detection unit 130 and the reflected power detection unit 140, and the forward power P1 and the reflected power P2 are thus detected. The detected forward power P1 and reflected power P2 are input to the reflection coefficient calculation part 300 of the SWR operation unit 150.

Thereafter, the reflection coefficient calculation part 300 calculates a reflection coefficient by using the forward power P1 and the reflected power P2.

That is, the reflection coefficient calculation part 300 calculates a reflection coefficient (Γ) by using, for example, Equation 1 below:

$$\Gamma = \frac{P_2}{P_1} \qquad \text{Equation 1}$$

The reflection coefficient, calculated by the reflection coefficient calculation part 300, is input to the SWR calculation part 310, and the SWR calculation part 310 calculates an SWR value by using Equation 2 below, and the calculated SWR value is input to the impedance control unit 160:

$$SWR = \frac{1 + |\Gamma|}{1 - |\Gamma|} \qquad \text{Equation 2}$$

The impedance control unit 160 determines an SWR from the output signal of the SWR calculation part 310 of the reflection coefficient calculation part 300.

Figure 4:
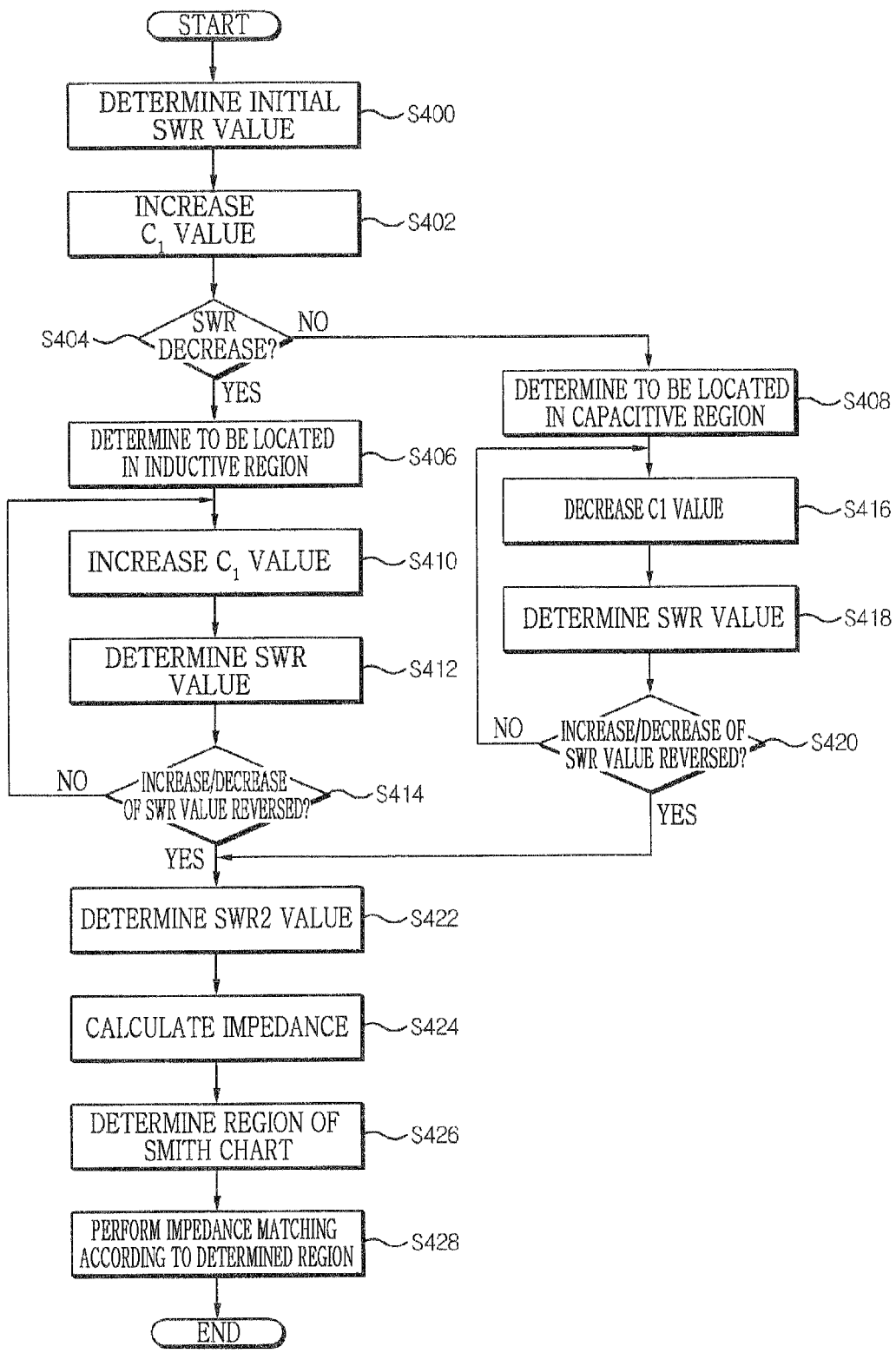
FIG. 4 is a flowchart showing the operation of an impedance control unit in an impedance matching method according to an embodiment.

FIG. 4 is a flowchart showing the operation of the impedance control unit in an impedance matching method according to an embodiment. Referring to FIG. 4, the impedance control unit 160 determines an initial SWR from the output signal of the SWR calculation part 310 in operation S400. That is, the impedance control unit 160 determines an initial SWR at the time when the impedance control of the impedance matching unit 120 has not been controlled.

When the initial SWR is determined, the impedance control unit 160 generates a control signal to thus change the impedance of the impedance matching unit 120. For example, the impedance control unit 160 controls the variable capacitor $C_1$ of the impedance matching unit 160 so as to increase a capacitance value in operation S402. Here, the capacitance of the variable capacitor C1 has a value of zero at an initial stage.

Thereafter, in operation S404, the impedance control unit 160 determines from the output signal of the SWR calculation part 310 whether or not the SWR decreases as the capacitance value of the variable capacitor C1 is increased.

When it is determined that the SWR value decreases, the impedance control unit 160 determines that the total impedance of the antenna 110 and the impedance matching unit 120 is located in an inductive region of the Smith chart in operation S406. However, when it is determined that the SWR value increases, the impedance control unit 160 determines that the current impedance of the antenna 110 is located in a capacitive region of the Smith chart in operation S408.

Figure 5:
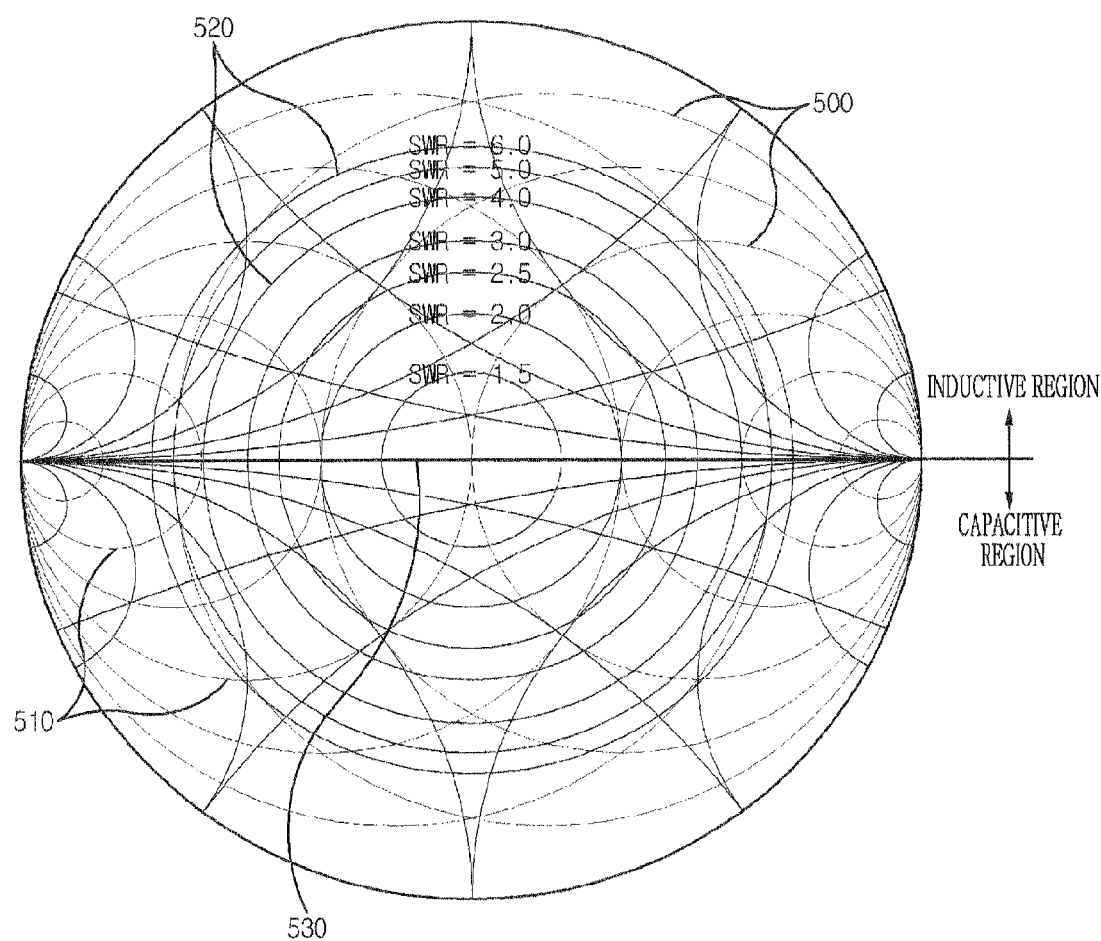
FIG. 5 is a view for explaining the configuration of a Smith chart.

FIG. 5 is a view illustrating a Smith chart. Here, reference numeral 500 indicates impedance curves, reference numeral 510 indicates admittance curves, and reference numeral 520 indicates SWR curves.

In this Smith cart, a region above a real axis 530 is the inductive region, and a region under the real axis 530 is the capacitive region.

Figure 6A:
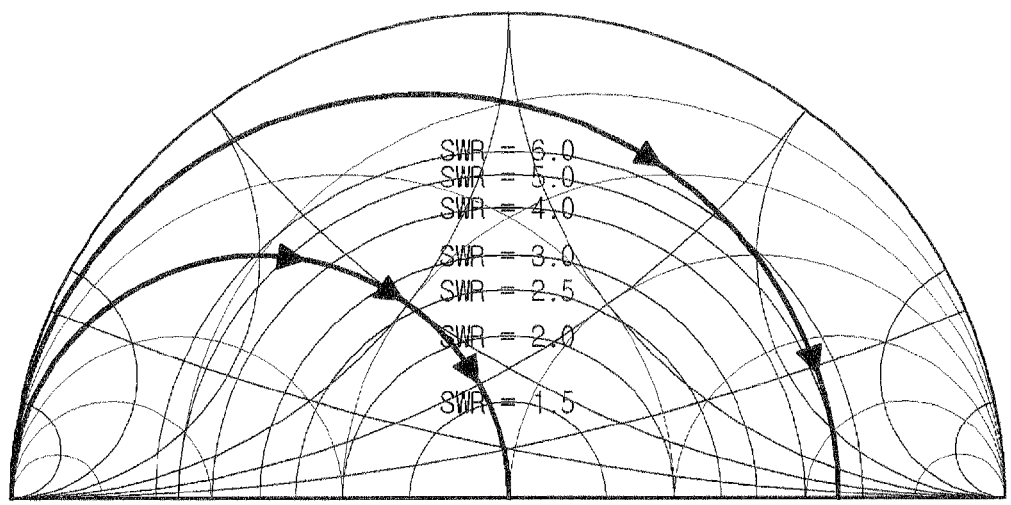
FIGS. 6A and 6B are views for explaining how the total impedance of the antenna and the impedance matching unit is varied by varying the impedance of the impedance matching unit.
Figure 6B:
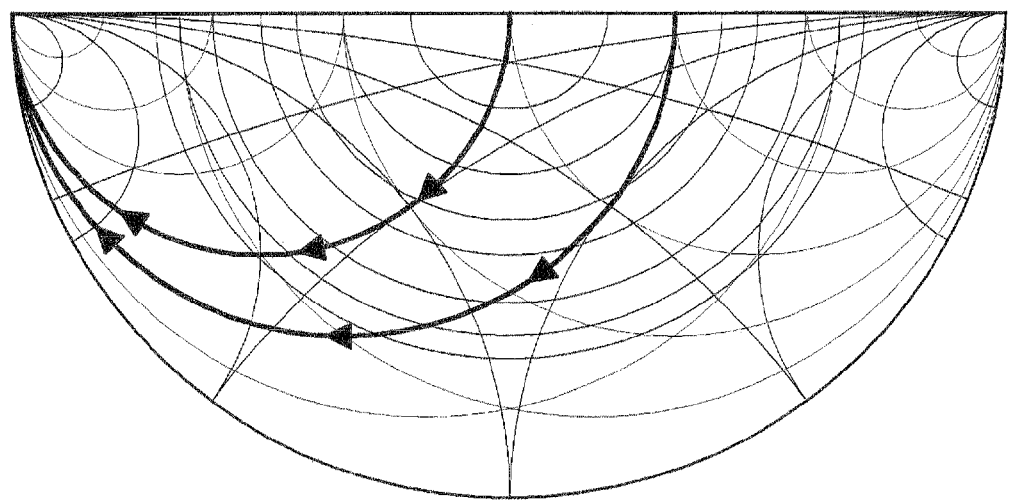

When the capacitance value of the variable capacitor C1 is increased, the total impedance of the antenna 110 and the impedance matching unit 120 is varied as shown in FIGS. 6A and 6B, for example.

That is, as shown in FIG. 6A, when the total impedance of the antenna 110 and the impedance matching unit is located in the upper inductive region, the SWR decreases as the capacitance value of the variable capacitor $C_1$ is increased.

Also, as shown in FIG. 6B, when the total impedance of the antenna 110 and the impedance matching unit 120 is located in the lower capacitive region, the SWR increases as the capacitance value of the variable capacitor $C_1$ is increased.

Therefore, when the capacitance value of the variable capacitor C1 is increased, the impedance control unit 160 may discriminate a decrease or a increase in an SWR value output from the SWR calculation part 310 in order to determine whether the total impedance of the antenna 110 and the impedance matching unit 120 is located in the upper inductive region or the lower capacitive region.

When it is determined that the total impedance of the antenna 110 and the impedance matching unit 120 is located in the inductive region, the impedance control unit 160 continuously increases the capacitance value of the variable capacitor C1 in operation S410, determines an SWR value from the output signal of the SWR calculation part 31 in operation S412, and determines whether or not an increase/decrease in the determined SWR value is reversed in operation S414.

That is, on the assumption that the total impedance of the antenna 110 and the impedance matching unit 120 is located in the inductive region, the SWR value decreases as the impedance control unit 160 increases the capacitance value of the variable capacitor $C_1$.

In this state, when the total impedance of the antenna 110 and the impedance matching unit 120 passes through the real axis 530, the SWR value increases as the capacitance value of the variable capacitor $C_1$ is increased.

Furthermore, when it is determined that the total impedance of the antenna 110 and the impedance matching unit 120 is located in the capacitive region, the impedance control unit 160 continuously decreases the capacitance value of the variable capacitor $C_1$ in operation S416, determines an SWR value from the output signal of the SWR calculation part 310 in operation S418, and determines whether or not an increase/decrease in the determined SWR value is reversed in operation S420.

That is, on the assumption that the total impedance of the antenna 110 and the impedance matching unit 120 is located in the capacitive region, the SWR value decreases as the impedance control unit 160 decreases the capacitance value of the variable capacitor $C_1$.

In such a state, if the total impedance of the antenna 110 and the impedance matching unit 120 passes through the real axis 530, the SWR value increases as the capacitance value of the variable capacitor $C_1$ is decreased.

When it is determined that the SWR value is not reversed in operation S414 and S420, the impedance control unit 160 returns to the operations S410 and S416 to continuously change the capacitance value of the variable capacitor $C_1$, and determines the SWR value to thereby repetitively determine whether or not the increase/decrease is reversed.

In such a state, if the increase/decrease in the SWR value is reversed, the impedance control unit 160 determines a current SWR value SWR$_2$ at the time when the increase/decrease of the SWR value is reversed in operation S422, and calculates the total impedance of the antenna 110 and the impedance matching unit 120 at the time when the impedance of the impedance matching unit 120 has not been controlled, by using the initial SWR value the current SWR value and the capacitance value of the variable capacitor $C_1$ in operation S424.

Here, the operation in which the total impedance of the antenna 110 and the impedance matching unit 120 is calculated at the time when the impedance of the impedance matching unit 120 has not been controlled will be described in detail.

When the impedance of the impedance matching unit 120 has not been controlled, the total impedance of the antenna 110 and the impedance matching unit 120 may be expressed by Equation 3 below:

$$Z_1 = R_1 + jX_1 \quad \text{Equation 3}$$

Also, when the increase/decrease of the SWR value is reversed, that is, when the total impedance of the antenna 110 and the impedance matching unit 120 meets the real axis 530, the total impedance may be expressed by Equation 4 below:

$$Z_2 = R_2 + jX_2 \quad \text{Equation 4}$$

Here, since the total impedance of the antenna 110 and the impedance matching unit 120 meets the real axis 530 and thus has a real value, the value of $X_2$ in Equation 4 is zero.

Therefore, Equation 4 may be expressed by Equation 5 below:

$$Z_2 = R_2 \quad \text{Equation 5}$$

A reflection coefficient may be expressed by Equation 6 below:

$$\Gamma = \frac{Z_L - Z_0}{Z_L + Z_0} \quad \text{Equation 6}$$

Then, a reflection coefficient ($\Gamma_1$) in the case of the initial total impedance of the antenna 110 and the impedance matching unit 120, a reflection coefficient ($\Gamma_2$) in the case where the total impedance of the antenna 110 and the impedance matching unit 120 meets the real axis 53 are expressed by Equations 7 and 8 below:

$$\Gamma_1 = \frac{R_1 + jX_1 - Z_0}{R_1 + jX_1 + Z_0} \quad \text{Equation 7}$$

$$\Gamma_2 = \frac{R_2 - Z_0}{R_2 + Z_0} \quad \text{Equation 8}$$

Then, the SWR value SWR$_1$ in the case of the initial total impedance of the antenna 110 and the impedance matching unit 120, and the SWR value SWR$_2$ in the case where the total impedance of the antenna 110 and the impedance matching unit 120 meets the real axis 530 are expressed by Equations 9 and 10 below:

$$SWR_1 = \frac{1 + |\Gamma_1|}{1 - |\Gamma_1|} \quad \text{Equation 9}$$

$$SWR_2 = \frac{1 + |\Gamma_2|}{1 - |\Gamma_2|} \quad \text{Equation 10}$$

Since the variable capacitor $C_1$ is connected in parallel to the total impedance of the antenna 110 and the impedance matching unit 120, the total impedance in the case where the total impedance of the antenna 110 and the impedance matching unit 120 meets the real axis 530 may be expressed by Equation 11 below:

$$Z_2 = \frac{1}{j\omega C_1} // (R_1 | jX_1) - $$

$$\frac{\frac{R_1}{\omega^2 C_1^2}}{R_1^2 + \left(X_1 - \frac{1}{\omega C_1}\right)^2} + j\frac{-\frac{R_1^2}{\omega C_1} - \frac{X_1^2}{\omega C_1} + \frac{X_1^2}{\omega^2 C_1^2}}{R_1^2 + \left(X_1 - \frac{1}{\omega C_1}\right)^2} \quad \text{Equation 11}$$

In Equation 9 above, a value of a real part $R_2$ or a value of an imaginary part $X_2$ are expressed by Equations 12 and 13 below:

$$R_2 = \frac{\frac{R_1}{\omega^2 C_1^2}}{R_1^2 + \left(X_1 - \frac{1}{\omega C_1}\right)^2} = \frac{R_1}{1 - \omega C_1 X_1} \quad \text{Equation 12}$$

$$X_2 = -\frac{R_1^2}{\omega C_1} - \frac{X_1^2}{\omega C_1} + \frac{X_1^2}{\omega^2 C_1^2} = \frac{X_1}{\omega C_1} - R_1^2 - X_1^2 = 0 \quad \text{Equation 13}$$

Here, if it is assumed that $\Gamma_2 > 0$, and $$A = \frac{\omega C_1 Z_0}{SWR_2} - \frac{X_1}{R_1},$$

the value of the real part $R_1$ and the value of the imaginary value $X_1$ in Equation 3 are expressed by Equations 14 and 15 below:

$$R_1 = \frac{A}{\omega C_1 (A^2 + 1)} \quad \text{Equation 14}$$

$$X_1 = \frac{A^2}{\omega C_1 (A^2 + 1)} \quad \text{Equation 15}$$

Here, if it is assumed that $\Gamma_2 < 0$, and $$B = \omega C_1 Z_0 SWR_2 = \frac{X_1}{R_1},$$

the value of the real part $R_1$ and the value of the imaginary part $X_1$ are expressed by Equations 16 and 17 below:

$$R_1 = \frac{B}{\omega C_1 (B^2 + 1)} \quad \text{Equation 16}$$

$$X_1 = \frac{B^2}{\omega C_1 (B^2 + 1)} \quad \text{Equation 17}$$

When the initial total impedance of the impedance matching unit 120 and the antenna 110 is calculated in the above manner, the impedance control unit 160 determines which region the initial total impedance belongs to in the Smith chart in operation S426.

Figure 7:
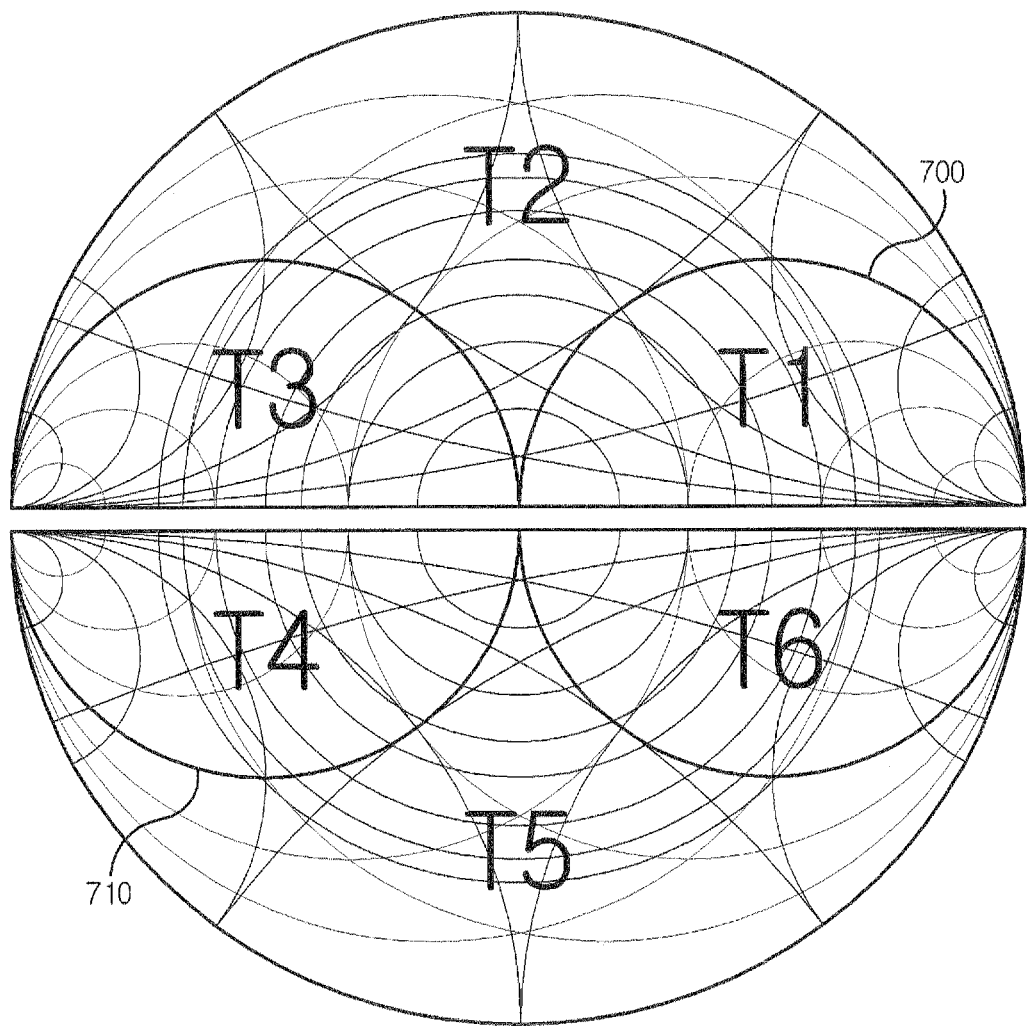
FIG. 7 is a view illustrating divided regions of the Smith chart according to an embodiment.

According to this embodiment, the Smith cart is divided into first to sixth regions T1 to T6 as shown in FIG. 7.

Here, the first region T1 is the inside region of an impedance circle 700 within the inductive region, the second region T2 is the outside region of the impedance circle 700 and an admittance circle 710 within the inductive region, and the third region T3 is the inside region of the admittance circle 710 within the inductive region.

Furthermore, the fourth region T4 is the inside region of the admittance circle 710 within the capacitive region, the fifth region T5 is the outside region of the impedance circle 700 and the admittance circle 710 within the capacitive region, and the sixth region T6 is the inside region of the impedance circle 700 within the capacitive region.

In the case of $\Gamma_2 > 0$, the initial total impedance is located in the first region T1 or the second region T2, and the value of the real part $R_1$ is compared with the required total impedance $Z_0$ of the impedance matching unit and the antenna 110.

When the result of the comparison reveals that the value of the real part $R_1$ is greater than the value of the total impedance, that is, when $$\frac{A}{\omega C_1 (A^2 + 1)} > Z_0,$$

the impedance control unit 160 determines that the initial total impedance is present in the first region T1. When $$\frac{A}{\omega C_1 (A^2 + 1)} < Z_0,$$

the impedance control unit 160 determines that the initial total impedance is present in the second region T2.

Also, when $\Gamma_2 > 0$, the impedance control unit 160 determines that the impedance control unit 160 is present in the third region T3.

Meanwhile, when the initial total impedance is located in the capacitive region, the operation of determining whether the initial total impedance is located in the fourth region T4, the fifth region T5 or the sixth region T6 is similar to the operation performed in the case where the initial total impedance is located in the inductive region. Thus, details of the operation are omitted.

When the region of the Smith chart in which the initial total impedance of the impedance matching unit 120 and the antenna 110 is located is determined in the above manner, the impedance control unit 160 selectively controls the capacitance of the variable capacitors $C_1$, $C_2$ and $C_3$ of the impedance matching unit 120, thus matching the impedance in operation S428.

Figure 8:
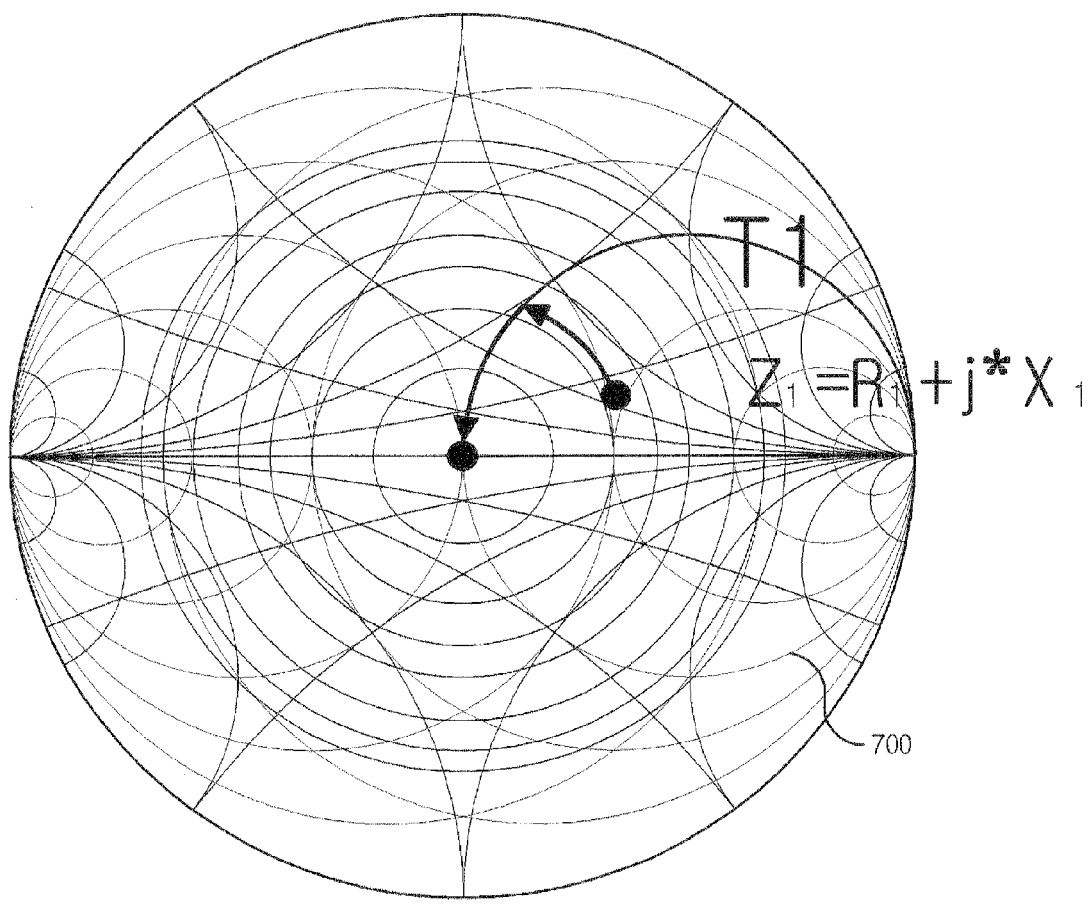
FIG. 8 is a view for explaining impedance matching when the initial total impedance of the impedance matching unit and the antenna is located in a first region.

For example, when the initial total impedance of the impedance matching unit 120 and the antenna 110 is located in the first region T1 of the Smith chart, as shown in FIG. 8, the impedance control unit 160 decreases the capacitance of the variable capacitor $C_3$ of the impedance matching unit 120 to thereby allow the total impedance of the impedance matching unit 120 and the antenna 110 to meet the impedance circle 700. Then, the impedance control unit 160 decreases the capacitance of the variable capacitor $C_2$ to thereby control the total impedance of the impedance matching unit 120 and the antenna 110 to have desired impedance $Z_0$.

Figure 9:
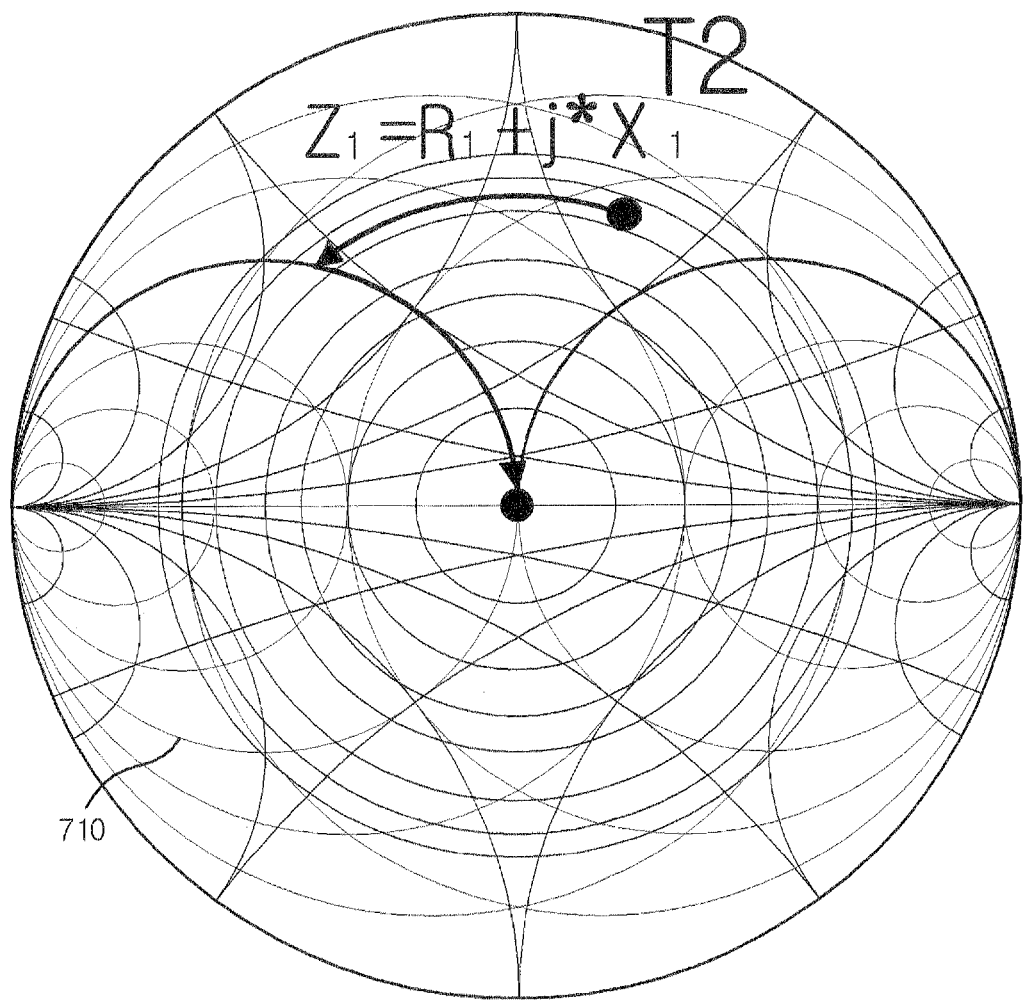
FIG. 9 is a view for explaining impedance matching when the initial total impedance of the impedance matching unit and the antenna is located in a second region.

When the initial total impedance of the impedance matching unit 120 and the antenna 110 is located in the second region T2 of the Smith chart, as shown in FIG. 9 the impedance control unit 160 decreases the capacitance of the variable capacitor $C_2$ of the impedance matching unit 120 to thereby allow the total impedance of the impedance matching unit 120 and the antenna 110 to meet the admittance circle 710. Thereafter, the impedance control unit 160 increases the capacitance of the variable capacitor $C_1$ to thus control the total impedance of the impedance matching unit 120 and the antenna 110 to have desired impedance $Z_0$.

Here, when the initial total impedance of the impedance matching unit 120 and the antenna 110 is located in the second region T2 of the Smith chart, the impedance control unit 160 may allow the total impedance of the impedance matching unit 120 and the antenna 110 to meet the impedance circle 700 and then to have desired impedance $Z_0$.

Figure 10:
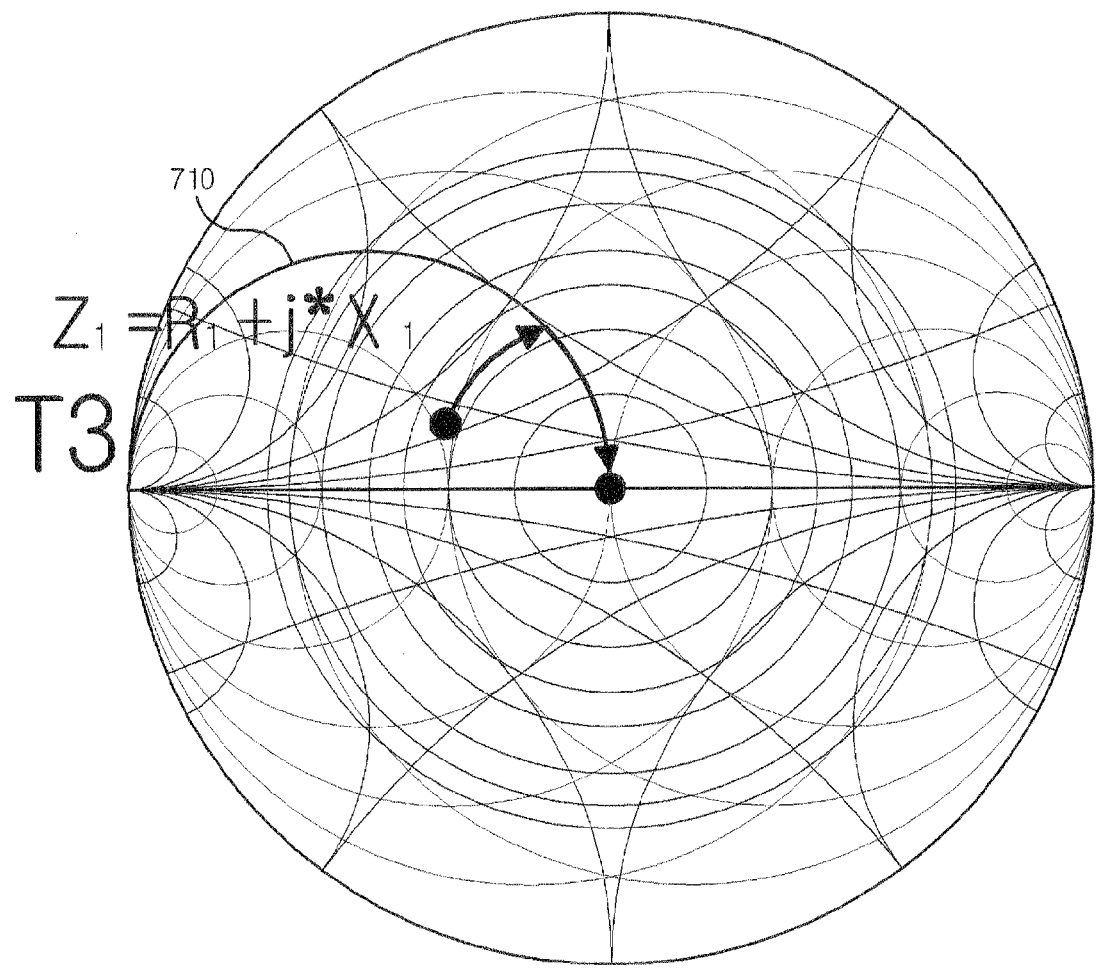
FIG. 10 is a view for explaining impedance matching when the initial total impedance of the impedance matching unit and the antenna is located in a third region.

When the initial total impedance of the impedance matching unit 120 and the antenna 110 is located in the third region T3 of the Smith chart, as shown in FIG. 10, the impedance control unit 160 increases the capacitance of the variable capacitor $C_2$ of the impedance matching unit 120 to thus allow the total impedance of the impedance matching unit 120 and the antenna 110 to meet the admittance circle 710. Thereafter, the impedance control unit 160 increases the capacitance of the variable capacitor $C_1$ to thus control the total impedance of the impedance matching unit 120 and the antenna 110 to have desired impedance $Z_0$.

Figure 11:
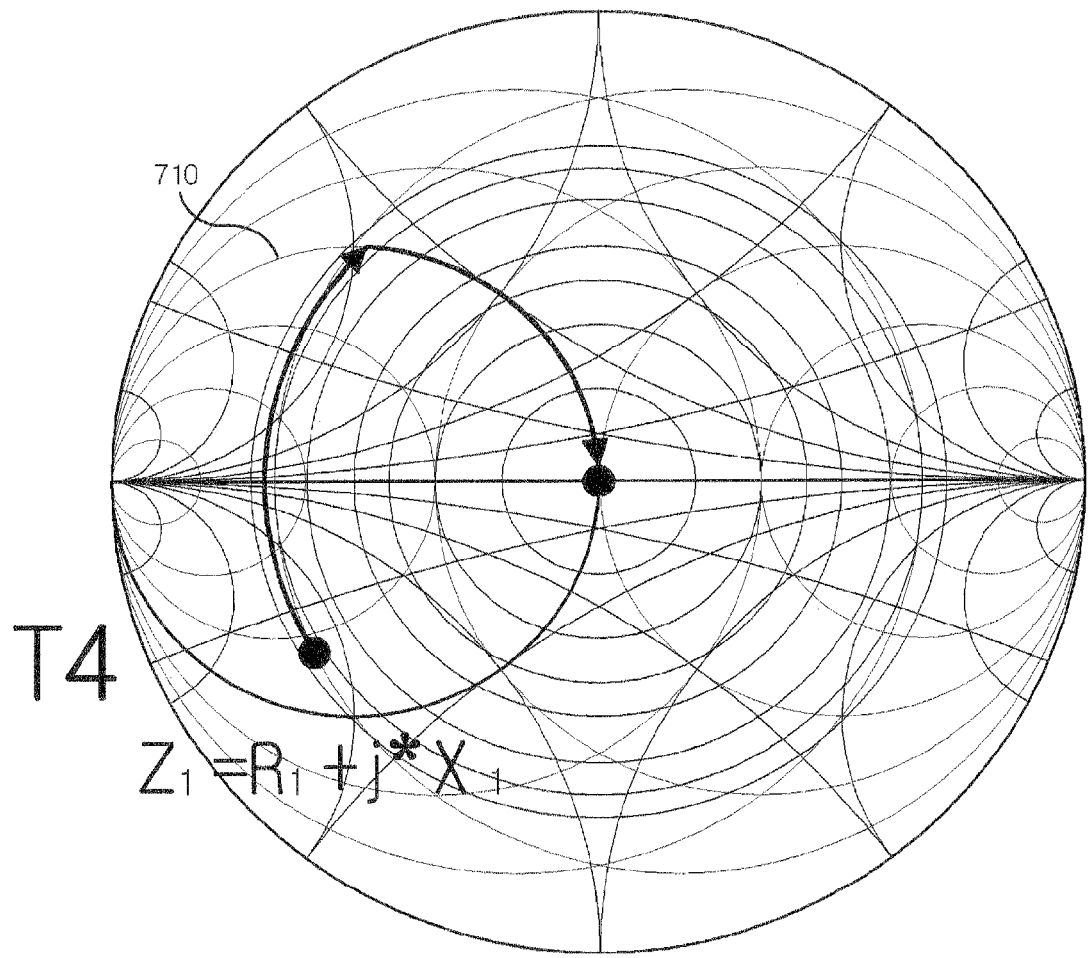
FIG. 11 is a view for explaining impedance matching when the initial total impedance of the impedance matching unit and the antenna is located in a fourth region.

When the initial total impedance of the impedance matching unit 120 and the antenna 110 is located in the fourth region T4 of the Smith chart, as shown in FIG. 11, the impedance control unit 160 increases the capacitance of the variable capacitor $C_2$ of the impedance matching unit 120 to thus allow the total impedance of the impedance matching unit 120 and the antenna 110 to meet the admittance circle 710. Thereafter, the impedance control unit 160 increases the capacitance of the variable capacitor $C_1$ to thus control the total impedance of the impedance matching unit 120 and the antenna 110 to have desired impedance $Z_0$.

Figure 12:
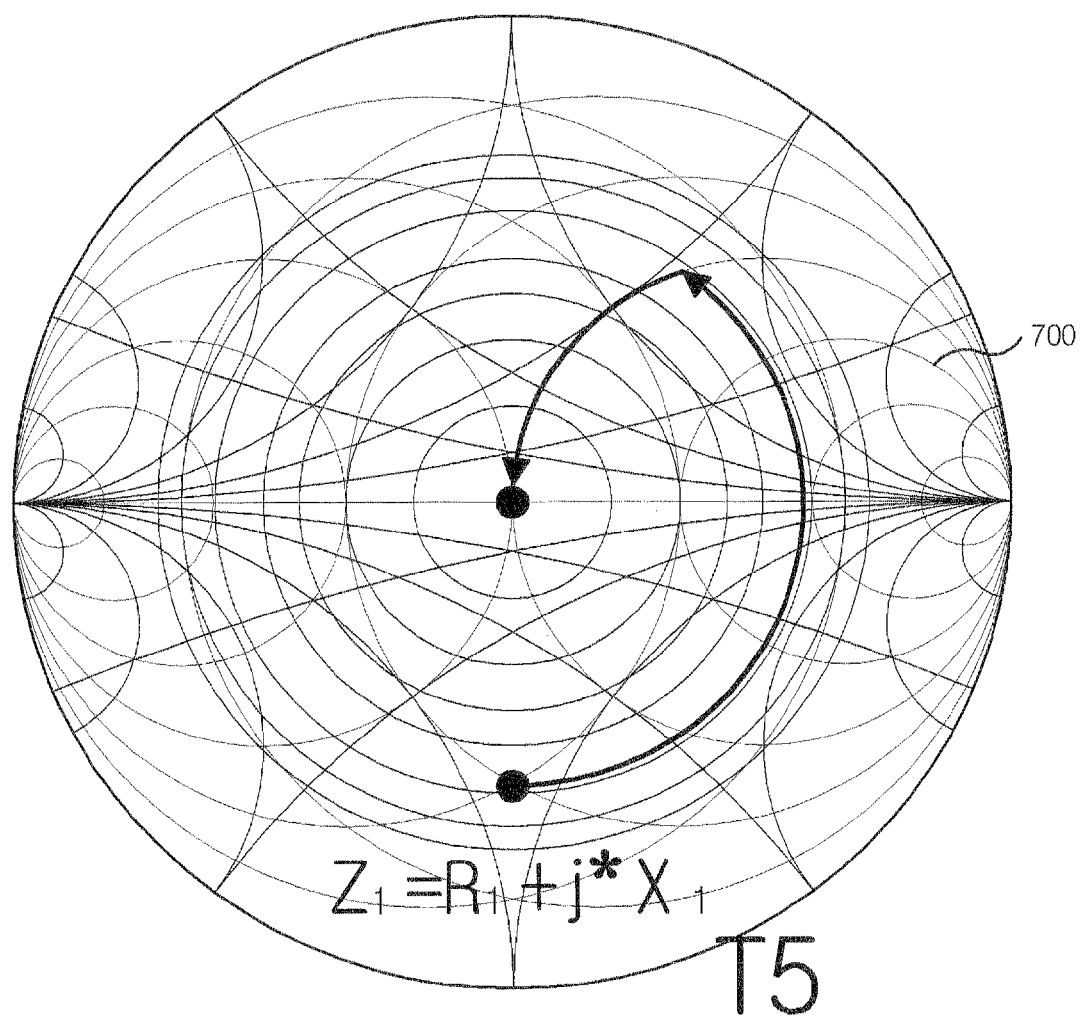
FIG. 12 is a view for explaining impedance matching when the initial total impedance of the impedance matching unit and the antenna is located in a fifth region.
Figure 13:
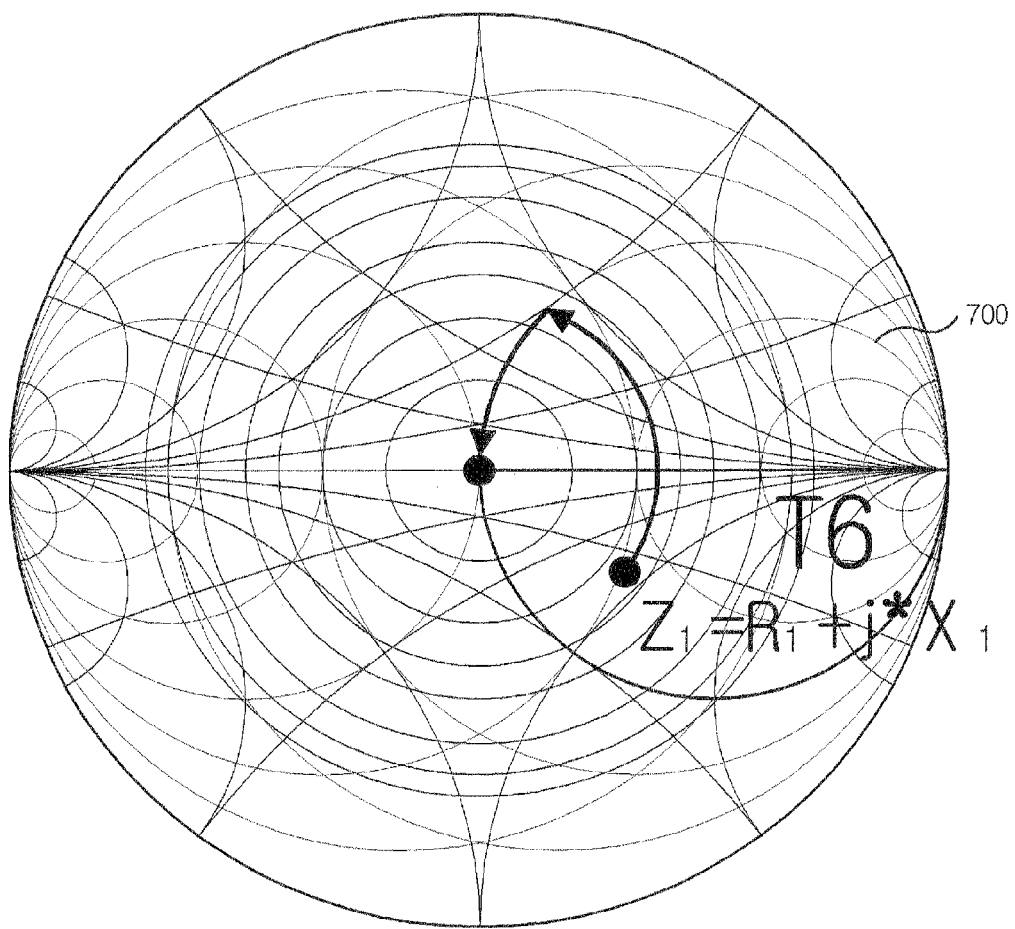
FIG. 13 is a view for explaining impedance matching when the initial total impedance of the impedance matching unit and the antenna is located in a sixth region.

When the initial total impedance of the impedance matching unit 120 and the antenna 110 is located in the fifth region T5 of the Smith chart, as shown in FIG. 12, the impedance control unit 160 decreases the capacitance of the variable capacitor $C_3$ of the impedance matching unit 120 to thus allow the total impedance of the impedance matching unit 120 and the antenna 110 to meet the impedance circle 700. Thereafter, the impedance control unit 160 decreases the capacitance of the variable capacitor $C_2$ to thus control the total impedance of the impedance matching unit 120 and the antenna 110 to have desired impedance $Z_0$.

When the initial total impedance of the impedance matching unit 120 and the antenna 110 is located in the sixth region T6 of the Smith chart, as shown in FIG. 12, the impedance control unit 160 decreases the capacitance of the variable capacitor $C_3$ of the impedance matching unit 120 to thus allow the total impedance of the impedance matching unit 120 and the antenna 110 to meet the impedance circle 700. Thereafter, the impedance control unit 160 decreases the capacitance of the variable capacitor $C_2$ to thus control the total impedance of the impedance matching unit 120 and the antenna 110 to have desired impedance $Z_0$.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus for matching impedance using Standing Wave Ratio (SWR) information, the apparatus comprising:
    a directional coupler extracting forward power of a transmission signal traveling to be transmitted through an antenna, and reflected power of the transmission signal reflected from the antenna;
    an impedance matching unit matching impedance of the antenna by varying impedance according to a control signal, wherein the impedance matching unit includes a variable capacitor;
    a forward power detection unit detecting the forward power from an output signal of the directional coupler;
    a reflected power detection unit detecting the reflected power from the output signal of the directional coupler;
    a SWR operation unit calculating a SWR by using the forward power detected by the forward power detection unit and the reflected power detected by the reflected power detection unit; and
    an impedance control unit determining whether an initial total impedance of the impedance matching unit and the antenna is located in a region of a plurality of regions of a Smith chart representing impedances of the impedance matching unit and the antenna by using dependencies of changes of SWR values calculated by the SWR operation unit upon changes of capacitance values of the variable capacitor, and changing the capacitance values of the variable capacitor of the impedance matching unit according to the determined region to control impedance of the antenna to be matched;
    wherein the region of the Smith chart is divided into first to sixth sub-regions (T1 to T6),
    wherein a first sub-region (T1) is an inner area of an impedance circle (700) within an inductive region of the Smith chart, a second sub region (T2) is an outer area of the impedance circle (700) and an admittance circle (710) within the inductive region, a third sub-region (T3) is an inner area of the admittance circle (710) within the inductive region, a fourth sub-region (T4) is an inner area of the admittance circle (710) within a capacitive region of the Smith chart, a fifth sub-region (T5) is an outer area of the impedance circle (700) and the admittance circle (710) within the capacitive region, and a sixth sub-region (T6) is the inner are of the impedance circle (700) within the capacitive region, and
    wherein the impedance circle (700) and the admittance circle (710) pass through a center point of a real axis of the Smith chart.

2. The apparatus according to claim 1, wherein the SWR operation unit comprises:
    a reflection coefficient calculation part calculating a reflection coefficient by using the forward power detected by the forward power detection unit and the reflected power detected by the reflected power detection unit; and
    a SWR calculation part calculating a SWR from the reflection coefficient calculated by the reflection coefficient calculation part.

3. The apparatus according to claim 1, wherein the impedance control unit
    determines a first SWR value when the impedance of the impedance matching unit is not controlled;
    increases the capacitance value of the variable capacitor of the impedance matching unit;
    determines whether the first SWR value decreases as the capacitance value of the variable capacitor is increased;
    determines that a total impedance of the antenna and the impedance matching unit is located in an inductive region of the Smith chart representing the impedances of the impedance matching unit and the antenna when the SWR value is decreased, and determines that a total impedance of the antenna and the impedance matching unit is located in a capacitive region of the Smith chart when the SWR value is increased;
    continuously increases the capacitance value of the variable capacitor when the total impedance is located in the inductive region, and continuously decreases the capacitance value of the variable capacitor when the total impedance is located in the capacitive region;
    determines whether an increase or a decrease of the SWR value is reversed by the continuously increasing or decreasing of the capacitance value;
    determines a second SWR value when the increase or the decrease of the SWR value is reversed;
    calculates values of real and imaginary parts of the total impedance when the impedance of the impedance matching unit is not controlled, by using the first SWR value, the second SWR value and the capacitance value corresponding to the second SWR value;
    determines a region of the Smith chart in which the first total impedance is located by using the calculated values of the real and imaginary parts; and
    controls the impedance of the impedance matching unit such that the total impedance meets the impedance circle or the admittance circle according to the determined region of the Smith chart to have desired impedance.

4. A method for matching impedance using Standing Wave Ratio (SWR) information, the method comprising:
    determining a first SWR value when impedance of an impedance matching unit is not controlled;
    increasing a capacitance value of a variable capacitor of the impedance matching unit;
    determining whether the first SWR value decreases as the capacitance value of the variable capacitor is increased;

determining that a total impedance of an antenna and the impedance matching unit is located in an inductive region of a Smith chart representing impedances of the impedance matching unit and the antenna when the first SWR value is decreased, and determining that the total impedance is located in a capacitive region of the Smith chart when the first SWR value is increased;

increasing the capacitance value of the variable capacitor when the total impedance is located in the inductive region, and decreasing the capacitance value of the variable capacitor when the total impedance is located in the capacitive region;

determining whether an increase or a decrease of the first SWR value is reversed by the increasing or decreasing of the capacitance value;

determining a second SWR value when the increase or decrease of the second SWR value is reversed;

calculating values of real and imaginary parts of the total impedance when impedance of the impedance matching unit is not controlled, by using the first SWR value, the second SWR value, and the capacitance value corresponding to the second SWR value;

determining a region of the Smith chart in which the total impedance is located by using the calculated values of the real and imaginary parts; and controlling the impedance of the impedance matching unit such that the total impedance meets an impedance circle or an admittance circle according to the determined region of the Smith chart.

5. The method according to claim 4, wherein the region of a Smith chart is divided into first to sixth sub-regions (T1 to T6), wherein a first sub-region (T1) is an inner area of the impedance circle (700) within the inductive region of the Smith chart, a second sub-region (T2) is an outer area of the impedance circle (700) and the admittance circle (710) within the inductive region, a third sub-region (T3) is an inner area of the admittance circle (710) within the inductive region, a fourth sub-region (T4) is an inner area of the admittance circle (710) within the capacitive region, a fifth sub-region (T5) is an outer area of the impedance circle (700) and the admittance circle (710) within the capacitive region, and a sixth sub-region (T6) is an inner area of the impedance circle (700) within the capacitive region, wherein the impedance circle (700) and admittance circle (710) pass through a center point of real axis of the Smith chart.

6. The method according to claim 4, wherein, the controlling of the impedance comprises controlling the impedance of the impedance matching unit such that the total impedance of the impedance matching unit and the antenna meets the impedance circle or the admittance circle of the Smith chart to have desired impedance.

* * * * *